United States Patent
Langer et al.

(10) Patent No.: US 11,569,849 B2
(45) Date of Patent: Jan. 31, 2023

(54) APPARATUSES AND METHODS FOR WIRELESS COMMUNICATION

(71) Applicant: Apple Inc., Cupertino, CA (US)

(72) Inventors: Andreas Langer, Unterschleissheim (DE); Thomas Bruder, Grafing (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/761,421

(22) PCT Filed: Nov. 23, 2017

(86) PCT No.: PCT/US2017/063168
§ 371 (c)(1),
(2) Date: May 4, 2020

(87) PCT Pub. No.: WO2019/103746
PCT Pub. Date: May 31, 2019

(65) Prior Publication Data
US 2021/0006275 A1    Jan. 7, 2021

(51) Int. Cl.
*H04B 7/04* (2017.01)
*H04B 1/48* (2006.01)
(Continued)

(52) U.S. Cl.
CPC ........ *H04B 1/0475* (2013.01); *H04B 7/0413* (2013.01); *H03F 3/245* (2013.01); *H04B 1/0064* (2013.01)

(58) Field of Classification Search
None
See application file for complete search history.

(56) References Cited

U.S. PATENT DOCUMENTS

| | | | |
|---|---|---|---|
| 8,305,986 B2 * | 11/2012 | Zhang | H04L 5/001 370/329 |
| 8,483,156 B2 * | 7/2013 | Toskala | H04L 1/16 370/329 |

(Continued)

FOREIGN PATENT DOCUMENTS

| | | |
|---|---|---|
| CN | 101641868 A | 2/2010 |
| CN | 105075129 A | 11/2015 |

(Continued)

OTHER PUBLICATIONS

Search Report of CN Application No. 201780096456.4, dated Mar. 25, 2021, translation included, 2 pgs.

(Continued)

*Primary Examiner* — Pablo N Tran
(74) *Attorney, Agent, or Firm* — Kowert, Hood, Munyon, Rankin & Goetzel, P.C.

(57) ABSTRACT

An apparatus for wireless communication is provided. The apparatus includes a processing circuit configured to receive data to be wirelessly transmitted within a predefined frequency range. Further, the processing circuit is configured to generate a first radio frequency transmit signal of a first frequency range based on the data, and to generate a second radio frequency transmit signal of a second frequency range based on the data. The first frequency range and the second frequency range are subranges of the predefined frequency range. The apparatus further includes a front-end circuit configured to supply the first radio frequency transmit signal to a first antenna, and to supply the second radio frequency transmit signal to a second antenna.

17 Claims, 6 Drawing Sheets

(51) Int. Cl.
*H04B 1/00* (2006.01)
*H03F 3/68* (2006.01)
*H04B 1/04* (2006.01)
*H04B 7/0413* (2017.01)
*H03F 3/24* (2006.01)

(56) References Cited

U.S. PATENT DOCUMENTS

| | | | | |
|---|---|---|---|---|
| 8,576,791 | B2* | 11/2013 | Luo | H04L 5/0053 |
| | | | | 370/329 |
| 8,705,461 | B2* | 4/2014 | Bala | H04W 48/12 |
| | | | | 370/329 |
| 9,584,263 | B2* | 2/2017 | Kim | H04W 72/1268 |
| 10,250,209 | B2* | 4/2019 | Tsutsui | H03F 3/195 |
| 10,608,603 | B2* | 3/2020 | Yoshimi | H04B 1/0483 |
| 10,756,803 | B2* | 8/2020 | Leulescu | H04B 7/0691 |
| 11,251,818 | B2* | 2/2022 | Peng | H04B 1/0458 |
| 2010/0130218 | A1* | 5/2010 | Zhang | H04W 74/0833 |
| | | | | 455/450 |
| 2013/0040578 | A1* | 2/2013 | Khoshnevis | H04W 52/242 |
| | | | | 455/67.11 |
| 2013/0114578 | A1* | 5/2013 | Lim | H04B 7/0404 |
| | | | | 370/336 |
| 2013/0142113 | A1* | 6/2013 | Fong | H04W 52/146 |
| | | | | 370/328 |
| 2014/0185498 | A1* | 7/2014 | Schwent | H04L 5/02 |
| | | | | 370/297 |
| 2014/0273884 | A1 | 9/2014 | Mantravadi et al. | |
| 2014/0378075 | A1 | 12/2014 | Verma et al. | |
| 2017/0077983 | A1 | 3/2017 | Ella et al. | |
| 2022/0278703 | A1* | 9/2022 | Shounai | H01L 23/12 |

FOREIGN PATENT DOCUMENTS

| | | | | |
|---|---|---|---|---|
| EP | | 2618620 A1 * | 7/2013 | H04W 72/042 |
| WO | WO-2014178486 A1 * | | 11/2014 | H04B 15/00 |

OTHER PUBLICATIONS

International Search Report and Written Opinion of International Application No. PCT/2017/063168, dated Aug. 27, 2018, 10 pgs.
Second Office Action and Search Report of CN Application No. 201780096456.4, dated Sep. 13, 2021, translation included, 10 pgs.

* cited by examiner

APPARATUSES AND METHODS FOR WIRELESS COMMUNICATION

FIELD

The present disclosure relates to wireless communication. In particular, examples relate to apparatuses and methods for wireless communication.

BACKGROUND

Modern communication standards introduce and combine features that drive the complexity of the uplink front-end in mobile devices. For example, Multiple Input Multiple Output (MIMO) for uplink radio links or higher bandwidths (e.g. 200 MHz or more) in the uplink radio link are defined in modern communication standards. These features may increase the size, the power consumption as well as the cost of the uplink front-end.

Hence, there may be a desire for improved wireless communication techniques.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality.

Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
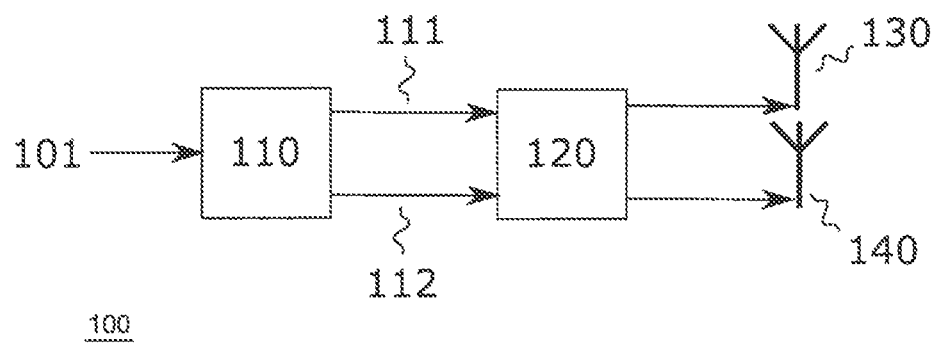
FIG. 1 illustrates a first example of an apparatus for wireless communication.

FIG. 1 illustrates an apparatus 100 for wireless communication (for a mobile device). Apparatus 100 comprises a processing circuit 110 configured to receive data 101 to be wirelessly transmitted within a predefined frequency range. The data 101 may be any data to be wirelessly transmitted. For example, the data 101 may be baseband data or radio frequency (RF) data. The data 101 may be received via one or more signals (data streams).

Further, processing circuit 110 is configured to generate a first RF transmit signal 111 of a first frequency range based on the data 101. Additionally, processing circuit 110 is configured to simultaneously (concurrently) generate a second RF transmit signal 112 of a second frequency range based on the data 101. The first frequency range and the second frequency range are subranges of the predefined frequency range. For example, first frequency range may cover a first part of the predefined frequency range, whereas the second frequency range covers a different second part of the predefined frequency range. If the predefined frequency range is, e.g., from 2500 MHz to 2570 MHz, the first frequency range may be from 2500 MHz to 2535 MHz and the second frequency range may be from 2535 MHz to 2570 MHz. However, it is to be noted that the above numerical example is for illustrative purposes only and, hence, not limiting the present disclosure.

Apparatus 100 further comprises a front-end circuit 120 configured to supply the first RF transmit signal 111 to a first antenna 130. Front-end circuit 120 is additionally configured to simultaneously (concurrently) supply the second RF transmit signal 112 to a (different) second antenna 130. The first antenna 120 and the second antenna 130 (simultaneously/concurrently) radiate the first RF transmit signal 111 and the second RF transmit signal 112 to the environment. The front-end circuit 120 may comprise signal-transferring as well as signal-processing components (circuitry) in order to conduct the first RF transmit signal 111 and the second RF transmit signal 112 to the antennae 120 and 130, respectively. The front-end circuit 120 may comprise signal lines together with one or more power amplifiers, filter circuits and/or switching circuits. For example, the front-end circuit 120 may comprises a first transmit path configured to couple the processing circuit 110 to the first antenna 130, and a second transmit path configured to couple the processing circuit 110 to the second antenna 140.

In some examples, the processing circuit 110 may additionally be configured to generate one or more further RF transmit signals in further subranges of the predefined frequency range. Accordingly, the front-end circuit 120 may be configured to supply the one or more further RF transmit signals to one or more further antennae. In general, the processing circuit 110 may be configured to generate n RF transmit signals (with n being two or more), wherein the frequency range of each of the n RF transmit signals is a subrange of the predefined frequency range. Accordingly, the front-end circuit 120 may be configured to supply each of the n RF transmit signals to an associated antenna out of n antennae. That is, the front-end circuit 120 may allow to map n RF transmit signals to n antennae.

Splitting up the data to be wirelessly transmitted within a predefined frequency range into at least two RF transmit signals (each having a frequency range which is a subrange of the predefined frequency range) may allow to transmit data over a wide frequency range while keeping the requirements for the front-end circuit 120 moderate. Since the frequency ranges of the individual RF transmit signals supplied to the antennae by means of front-end circuit 120 are narrow compared to the predefined frequency range, the requirements on the front-end circuit 120 for transferring and processing these individual signals may be moderate compared to the requirements for transferring and processing a single signal exhibiting the predefined frequency range to only one antenna. In addition, the (simultaneous/concurrent) usage of multiple RF transmit signals may allow to wirelessly transmit data within a frequency range which cannot be achieved for a single RF transmit signal, i.e. the predefined frequency range may be selected larger than for conventional signal transmission.

The data 101 may, e.g., comprise at least two component carriers (i.e. frequency blocks of data with a predetermined bandwidth) according to a communication standard (e.g. LTE or 5G NR). Accordingly, the processing circuit 110 may be configured to generate the first RF transmit signal 111 based on one of the at least two component carriers, and to generate the second RF transmit signal 112 based on another one of the at least two component carriers. In other words, the RF transmit signals are generated based on different component carriers. That is, one component carrier is transmitted via the first antenna 130, whereas the other component carrier is transmitted via the second antenna 140. Apparatus 100 may, hence, allow uplink carrier aggregation using different antennae for different component carriers.

While in some examples, the data (e.g. the component carriers) is to be transmitted contiguously within the predefined frequency range (i.e. in a continuous frequency section of the predefined frequency range), the data (e.g. the component carriers) is to be transmitted non-contiguously within the predefined frequency range (i.e. in discontinuous frequency sections of the predefined frequency range) in other examples. Hence, the data 101 (e.g. the component carriers) may be contiguous (continuous) or non-contiguous (discontinuous) in the frequency domain. Accordingly, the first frequency range and the second frequency range may directly follow each other or be separated from each other by a frequency gap. That is, apparatus 100 may allow contiguous or non-contiguous uplink carrier aggregation using different antennae for different component carriers.

For example, the first frequency range and the second frequency range may be within a frequency band defined in the communication standard. Alternatively, the first frequency range and the second frequency range may be within different frequency bands defined in the communication standard. That is, apparatus 100 may allow intra-band uplink carrier aggregation as well as inter-band uplink carrier aggregation. The communication standard may, e.g., be a communication standard for cellular communication.

In the present disclosure, RF transmit signals as well as circuits for generating and/or processing these signals (e.g. processing circuit 110 or front-end circuit 120) may be configured to operate according to one of the $3^{rd}$ Generation Partnership Project (3GPP)-standardized mobile communication networks or systems. The mobile or wireless communication system may correspond to, for example, a 5th generation wireless system (5th generation mobile network, 5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

If the data 101 is to be wirelessly transmitted via contiguous intra-band uplink carrier aggregation (i.e. the predefined frequency range covers the one used frequency band), both transmit paths (transmit chains) of front-end circuit 120 may, e.g., be configured to support different frequency ranges in the same frequency band (e.g. a frequency band defined by the 3GPP). Then, at least one component carrier is transmitted (radiated) via the first antenna 130, and at least one component carrier is transmitted (radiated) via the second antenna 140. This is different to conventional approaches in which all component carriers in a certain frequency band are transmitted via a single transmit chain and a single antenna. However, severe design challenges (restraints) conventionally arise if a transmit chain needs to support high channel bandwidths (e.g. more than 80 MHz or more than 100 MHz). By using at least a second transmit path to the second antenna 140, the channel bandwidths which need to be supported by the individual transmit paths may be kept low (moderate).

For example, if a signal according to the 5G NR communication standard with 200 MHz bandwidth (e.g. comprising 2 component carriers) is to be transmitted, the processing circuit 120 may generate the first RF transmit signal 111 in a first frequency range with 100 MHz bandwidth (for the first component carrier) and the second RF transmit signal 112 in a directly following second frequency range with 100 MHz bandwidth (for the second component carrier). Both signals may be (simultaneously/concurrently) radiated to the environment by the first antenna 130 and the second antenna 140. For the individual transmit paths of the front-end circuit 120, the requirements are much lower for processing RF signals having a bandwidth of 100 MHz than for processing a signal of 200 MHz bandwidth. For example, if an envelope tracking based DC-to-DC converter (tracker)

is used for powering a power amplifier in one of the transmit paths, the design complexity for 100 MHz bandwidth is (greatly) reduced compared to a signal bandwidth of 200 MHz.

Similarly, if the data 101 is to be wirelessly transmitted via non-contiguous intra-band uplink carrier aggregation, both transmit paths (transmit chains) of front-end circuit 120 may, e.g., be configured to support different frequency ranges in the same frequency band (e.g. a frequency band defined by the 3GPP). Compared to the above contiguous use case, the first cluster of component carriers (comprising one or more component carriers) is separated in the frequency domain from the second cluster of component carriers (comprising one or more component carriers). Generating individual RF transmit signals for the individual clusters of component carriers and radiating each of these RF transmit signals to the environment using an individual antenna is a smart way to support this feature.

In some examples, processing circuit 110 may be configured to generate the first RF transmit signal 111 according to a first communication standard, and to simultaneously (concurrently) generate the second RF transmit signal 112 according to a second communication standard. This may, e.g., allow concurrent cellular+connectivity operation of apparatus 100 or dual connectivity operation of apparatus 100. For example, the first RF transmit signal 111 may be generated according to a cellular standard (e.g. e.g. according to the LTE or 5G NR standard) in the first frequency range, whereas the second RF transmit signal 112 may be generated according to a communication standard for WLAN in the second frequency range. In some examples, the first RF transmit signal 111 may be generated according to a first cellular standard (e.g. e.g. according to the LTE standard) in the first frequency range, whereas the second RF transmit signal 112 may be generated according to a second cellular standard (e.g. e.g. according to the 5G NR standard) in the second frequency range. The first RF transmit signal 111 may, e.g., be based on a first component carrier to be transmitted using the first cellular standard, whereas the second RF transmit signal 112 may be based on a second component carrier to be transmitted using the second cellular standard.

If the data 101 is to be wirelessly transmitted via interband uplink carrier aggregation (i.e. the predefined frequency range spans all used frequency bands), the first transmit path of front-end circuit 120 may be configured to support a first frequency range (e.g. a first frequency band defined by the 3GPP), whereas the second transmit path of front-end circuit 120 may be configured to support a different second frequency range (e.g. a second frequency band defined by the 3GPP). Accordingly, first antenna 130 transmits the first RF transmit signal (for one or more first component carriers) in the first frequency range to the environment, whereas second antenna 140 transmits the second RF transmit signal (for one or more second component carriers) in the second frequency range to the environment.

In some examples, one or more transmit paths of the front-end circuit 120 may support multiple different configuration states. For example, the different configuration states may relate to different settings of individual components (circuits) of the transmit path for different frequency ranges or different communication standards of the RF transmit signal to be processed by the transmit path. This may allow to use the same transmit path for transferring RF transmit signals of different frequency ranges and/or for transferring RF transmit signals according to different communication standards to the first antenna. Accordingly, a smaller number of transmit paths and antennae may be used for radiating RF transmit signals of different frequency ranges or different communication standards to the environment. Accordingly, size, area consumption and cost of front-end circuit 120 may be reduced compared to conventional approaches.

The first transmit path of front-end circuit 120 may, e.g., support at least two different configuration states. Accordingly, apparatus 100 may further comprise a control circuit (not illustrated) configured to adjust the first transmit path to one of the at least two configuration states based on the first frequency range of the first RF transmit signal 111, which is transferred by the first transmit path to first antenna 130. Alternatively or additionally, the control circuit may be configured to adjust the first transmit path to one of the at least two configuration states based on a communication standard according to which the first radio frequency transmit signal 111 is generated by processing circuit 110 (further details of adjusting a transmit path based on the communication standard of the RF transmit signal are given below).

In some examples, the first transmit path of front-end circuit 120 comprises a first power amplifier configured to amplify the first RF transmit signal, wherein the first power amplifier supports at least two different output impedance configurations. By supporting different output impedance configurations, the first power amplifier may be adjusted (tuned) to different frequency ranges of the first RF transmit signal 111. Accordingly, the control circuit of apparatus 100 may be further configured to adjust the first power amplifier to one of the at least two output impedance configurations based on the first frequency range of the first RF transmit signal 111. That is, the operation of the power amplifier may be adjusted (tuned) to the frequency range of the first RF transmit signal 111, so that the first transmit path may be used for different frequency ranges of the first RF transmit signal 111.

Apparatus 100 may optionally further comprise an envelope tracking circuit (e.g. a controlled DC-to-DC converter) configured to supply a supply voltage to the first power amplifier based on only the subset of the data that is used by processing circuit 110 for generating the first RF transmit signal 111. Accordingly, the supply voltage for the first power amplifier may be adjusted (tuned) to the envelope of the first RF transmit signal 111. The first power amplifier may, hence, be operated in a very efficient manner.

In some examples, the first transmit path may further comprise a first filter circuit configured to filter the first RF transmit signal 111. The first filter circuit supports at least two different filter configurations for different frequency ranges of the first RF transmit signal 111. For example, the first filter circuit may be an adaptive filter or the first filter circuit may comprise a plurality (e.g. two or more) filter banks which may be selectively used for filtering the first RF transmit signal 111. Accordingly, the control circuit of apparatus 100 may be further configured to adjust the first filter circuit to one of the at least two filter configurations based on the first frequency range of the first RF transmit signal 111. That is, the operation of the first filter circuit may be adjusted (tuned) to the frequency range of the first RF transmit signal 111, so that the first transmit path may be used for different frequency ranges of the first RF transmit signal 111.

In order to reduce the complexity of the front-end and to reduce the number of components of the front-end, the first filter circuit may, in some examples, further be configured to filter a RF receive signal received by the first antenna 130.

In other words, the first filter circuit may be used for both, transmit signals and receive signals.

As described above for the first transmit path, also the second (or a further) transmit path of front-end circuit 120 may support at least two different configuration states. Accordingly, the control circuit of apparatus 100 may be further configured to adjust the second (or a further) transmit path to one of the at least two configuration states based on the second frequency range (or the frequency of a further RF transmit signal). Likewise, the second (or a further) transmit path of front-end circuit 120 may comprise a power amplifier, a filter circuit, an envelope tracking circuit etc. as described above.

More details of front-end circuit 120 and its components will be described below in connection with FIGS. 3 to 5.

While the broad lines of the first aspect of the present disclosure are described above in connection with FIG. 1, the basics of a second aspect of the present disclosure will described below in connection with FIG. 2.

Figure 2:
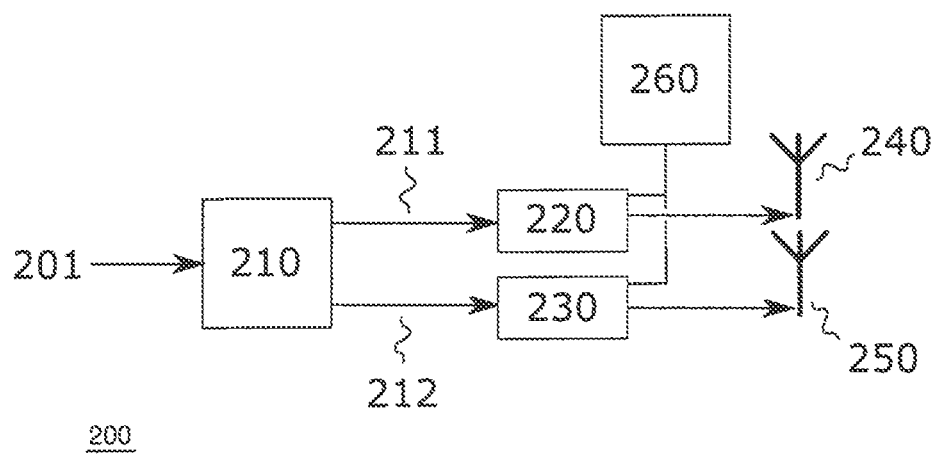
FIG. 2 illustrates a second example of an apparatus for wireless communication.

FIG. 2 illustrates another apparatus 200 for wireless communication (for a mobile device). Also apparatus 200 comprises a processing circuit 210 configured to receive data 201 to be wirelessly transmitted. Processing circuit 210 is further configured to generate a first RF transmit signal 211 based on the data 201, and to simultaneously (concurrently) generate a second RF transmit signal 212 based on the data 201.

Apparatus 200 additionally comprises a first transmit path 220 configured to supply the first RF transmit signal 211 to a first antenna 240 for radiation to the environment. Further, apparatus 200 comprises a second transmit path 230 configured to simultaneously (concurrently) supply the second RF transmit signal 212 to a second antenna 250 for radiation to the environment. Again, the first RF transmit signal 211 and the second RF transmit signal 212 are simultaneously (concurrently) radiated to the environment by the first antenna 240 and the second antenna 250.

The first transmit path 220 supports at least two different configuration states. For example, the different configuration states may relate to different settings of individual components (circuits) of the first transmit path 220 for different frequency ranges of the first RF transmit signal 211 or for different communication standards according to which the first RF transmit signal 211 is generated by processing circuit 210. The first transmit path 220 may, e.g., comprise signal lines together with one or more power amplifiers, filter circuits and/or switching circuits.

Apparatus 200 further comprises a control circuit 260 configured to adjust the first transmit path 220 to one of the at least two different configuration states based on a characteristic of the first RF transmit signal 211. The characteristic of the first RF transmit signal 211 may be any parameter that characterizes the first RF transmit signal 211. For example, the characteristic of the first RF transmit signal 211 may be a frequency range of the first RF transmit signal 211 and/or a communication standard (see examples described in connection with FIG. 1) according to which the first RF transmit signal 211 is generated by processing circuit 210.

The reconfigurable first transmit path 220 may allow to use the same transmit path for transferring RF transmit signals of, e.g., different frequency ranges or different communication standards to the first antenna 240. Accordingly, a smaller number of transmit paths and antennae may be used for radiating RF transmit signals of different frequency ranges or different communication standards to the environment. Therefore, size, area consumption and cost of the front-end to the antennae may be reduced compared to conventional approaches.

In some examples, processing circuit 210 may additionally be configured to generate one or more further RF transmit signals based on the data 201. Accordingly, apparatus 200 may comprise additional transmit paths configured to supply the one or more further RF transmit signals to one or more further antennae. In general, apparatus 200 may allow to map n RF transmit signals to n antennae.

As described above for the first transmit path 220, also the second (or a further) transmit path 230 may support at least two different configuration states. Accordingly, the control circuit 260 may be further configured to adjust the second (or a further) transmit path 230 to one of the at least two configuration states based on a characteristic of the second RF transmit signal 212 (or a further RF transmit signal). Similarly, the characteristic of the second RF transmit signal 212 may be a frequency range of the second RF transmit signal 212 (or a further RF transmit signal) and/or a communication standard according to which the second RF transmit signal 212 (or a further RF transmit signal) is generated by processing circuit 220.

As described above in connection with apparatus 100, also the data 201 received by processing circuit 210 of apparatus 200 may comprise at least two component carriers according to a communication standard. Processing circuit 200 may, hence, be configured to generate the first RF transmit signal 211 based on one of the at least two component carriers, and to generate the second RF transmit signal 212 based on another one of the at least two component carriers. Also apparatus 200 may, hence, allow uplink carrier aggregation using different antennae for different component carriers.

In some examples, processing circuit 210 may be configured to generate the first RF signal 211 in a first frequency range, and to generate the second RF signal 212 in a second frequency range. The first frequency range may be different from the second frequency range. In some examples, the second frequency range may directly follow the first frequency range or be separated from the first frequency range by a frequency gap. Alternatively, the first frequency range may be equal to the second frequency range.

If the first frequency range is equal to the second frequency range, apparatus 200 may, e.g., allow to support uplink MIMO since two different signals of the same standard at the same frequency are radiated by the first antenna 240 and the second antenna 250. The first transmit path 220 and/or the second transmit path 230 may be adjusted to a specific supported configuration state based on, e.g., the frequency range used for the uplink MIMO signals or the communication standard of these signals (e.g. LTE 2×2 or WLAN 2×2). For example, the first transmit path 220 may be reconfigured by control circuit 260 to support the MIMO frequency range.

If the first frequency range is different from the second frequency range, apparatus 200 may, e.g., allow contiguous intra-band uplink carrier aggregation (i.e. the data 201 is to be transmitted contiguously within a predefined frequency range), non-contiguous intra-band uplink carrier aggregation (i.e. the data 201 is to be transmitted non-contiguously within a predefined frequency range) or inter-band uplink carrier aggregation as described above in connection with apparatus 100. In other words, the second frequency range of the second RF transmit signal 212 and the first frequency range of the first RF transmit signal 211 may be within a frequency band defined in a communication standard. Alternatively, the second frequency range of the second RF transmit signal 212 and the first frequency range of the first RF transmit signal 211 may be within different frequency bands defined in a communication standard. As described above, the communication standard may, e.g., be a communication standard for cellular communication.

In some examples, processing circuit 210 may be configured to generate the first RF transmit signal 211 according to a first communication standard, and to simultaneously (concurrently) generate the second RF transmit signal 212 according to a second communication standard.

This may, e.g., allow concurrent cellular+connectivity operation of apparatus 200. For example, the first transmit path 220 may accordingly be configured by control circuit 260 to support cellular transmission (e.g. according to the 5G NR standard) in a first frequency range, whereas the second transmit path 230 is configured by control circuit 260 to support WLAN transmission in a second frequency range.

The first transmit path 220 may, e.g., comprise a first power amplifier configured to amplify the first RF transmit signal 211. The first power amplifier supports at least two different output impedance configurations. By supporting different output impedance configurations, the first power amplifier may be adjusted (tuned) to different frequency ranges of the first RF transmit signal 211. The control circuit 260 may, hence, be further configured to adjust the first power amplifier to one of the at least two output impedance configurations based on a frequency range of the first RF transmit signal 211. That is, the operation of the power amplifier may be adjusted (tuned) to the frequency range of the first RF transmit signal 211, so that the first transmit path 220 may be used for different frequency ranges of the first RF transmit signal 211.

Further, control circuit 260 may be configured to adjust a bias voltage supplied to the first power amplifier based on the communication standard according to which the first RF transmit signal 211 is generated by the processing circuit 210. For example, different biasing profiles or settings may be used for different communication standards. Accordingly, the operation of the power amplifier may be adjusted (tuned) to the communication standard of the first RF transmit signal 211, so that the first transmit path 220 may be used for different communication standards.

Apparatus 200 may, in some examples, further comprise an envelope tracking circuit (e.g. a controlled DC-to-DC converter) configured to supply a supply voltage to the first power amplifier based on only a subset of the data that is used by processing circuit 210 for generating the first RF transmit signal 211. Accordingly, the supply voltage for the first power amplifier may be adjusted (tuned) to the envelope of the first RF transmit signal 211. The first power amplifier may, hence, be operated in a very efficient manner.

The envelope tracking circuit may support at least two different operational configurations. For example, the envelope tracking circuit may support different bandwidths, compression settings, etc. Therefore, control circuit 260 may be further configured to adjust the envelope tracking circuit to one of the at least two different operational configurations based on the communication standard according to which the first RF transmit signal 211 is generated by processing circuit 210. That is, the envelope tracking circuit may be adjusted to the communication standard of the first RF transmit signal 211, so that the envelope tracking circuit together with the first transmit path 220 may be used for different communication standards.

In some examples, the first transmit path 220 may further comprise a first filter circuit configured to filter the first RF transmit signal 211. The first filter circuit supports at least two different filter configurations for different frequency ranges of the first RF transmit signal 211. For example, the first filter circuit may be an adaptive filter or the first filter circuit may comprise a plurality (e.g. two or more) filter banks which may be selectively used for filtering the first RF transmit signal 211. Accordingly, the control circuit 260 may be further configured to adjust the first filter circuit to one of the at least two filter configurations based on the first frequency range of the first RF transmit signal 111. That is, the operation of the first filter circuit may be adjusted (tuned) to the frequency range of the first RF transmit signal 211, so that the first transmit path 220 may be used for different frequency ranges of the first RF transmit signal 211.

In order to reduce the complexity of the front-end and to reduce the number of components of the front-end, the first filter circuit may, in some examples, further be configured to filter a RF receive signal received by the first antenna 240. In other words, the first filter circuit may be used for both, transmit signals and receive signals. For example, in a Time Division Duplex (TDD) system, the filter circuits for filtering RF receive signals may be re-used as first filter circuit in order to filter the first RF transmit signal 211 (assuming the RF receive signal and the first RF transmit signal 211 are within the same frequency range, i.e. the first frequency range).

As described above for the first transmit path 230, also the second (or a further) transmit path 240 may comprise a power amplifier, a filter circuit, an envelope tracking circuit etc. as described above. That is, the processing circuit 260 may perform equivalent control of the second (or a further) transmit path 240 as described above in connection with the first transmit path 230.

More details of transmit paths and their components will be described below in connection with FIGS. 3 to 5.

In other words, a basic principle of apparatus 200 may be the smart reconfiguration of transmit paths (transmit chains) in order to enable new features, concurrent operation and break down of design complexity. As described above, a first transmit chain may be connected to a first antenna supporting a first frequency range and at least a second transmit chain may be connected to at least a second antenna supporting at least a second frequency range. The required signal generation may, e.g., be done using a RF transceiver. Each transmit chain may comprise a power amplifier, filtering and/or switches. Further, at least one transmit chain comprises means that enable reconfigurability, for example:

support of at least a second frequency range (e.g. by means of a switchable and/or tunable power amplifier matching); and/or support of at least a second communication standard.

The at least one reconfigurable transmit chain (more than transmit chain may be reconfigurable) may allow to selectively and concurrently transmit multiple RF transmit signals via a first antenna and/or at least a second antenna depending on the use case. In other words, apparatus 200 may enable a flexible mapping of n RF transmit signals to n antennae depending on the use case. For example, a RF transmit signal may be one or more component carriers according to the LTE standard, one or more component carriers according to the 5G NR standard or one or more channels according to the WLAN standard. As described above, the transmit chains may be reconfigured for the first or the second frequency range and/or to a first or a second communication standard depending on the use case.

In order to summarize the above description, the following use cases may be supported for two configurable transmit paths (transmit chains):
- single transmit signals in the first or second frequency range
- concurrent transmit operation in a first and a second frequency range (e.g. inter-band uplink carrier aggregation; Dual Sim Dual Activity, DSDA; dual connectivity; or cellular+connectivity)
- 2×2 MIMO (cellular, connectivity or any other standard)
- non-contiguous intra-band uplink carrier aggregation in one band
- contiguous intra-band uplink carrier aggregation in one band divided in half or any other sub-ranges (e.g. depending on the available envelope tracking bandwidth: Assuming a 200 MHz carrier aggregated bandwidth and a 100 MHz envelope tracker, two RF transmit signals each of 100 MHz bandwidth may be supported, which allows to lower the tracker design challenges and to reduce the drawn battery current)

If four or more configurable transmit paths (transmit chains) are used, the following use cases may be supported:
- concurrent transmit operation in four frequency ranges featuring the same or different standards in each frequency range (e.g. inter-band uplink carrier aggregation, DSDA, dual connectivity, cellular+connectivity)
- 4×4 MIMO (cellular, connectivity or any other standard)
- two systems supporting 2×2 MIMO
- non-contiguous intra-band uplink carrier aggregation in one band (e.g. up to four component carriers in one frequency band or two component carriers in first frequency band and two component carriers in a second frequency band)
- contiguous intra-band uplink carrier aggregation in one band, while limiting the envelope tracker bandwidth capability (e.g. assuming a 100 MHz tracker, up to 4×100 MHz contiguous bandwidth may be supported)

As described above, for TDD systems, receive filters in receive MIMO modules may be reused for transmit operation in the same frequency range and, hence, allow to maximize the hardware re-use.

That is, apparatus 200 may provide an efficient implementation of complex transmit features by front-end reconfiguration. This may allow hardware re-use and bread down of design complexity in terms of size, area and cost.

While some basic principles of wireless communication according to the present technique were described above in connection with FIGS. 1 and 2, more detailed examples of apparatuses for wireless communication according to the proposed technique are described in the following.

Figure 3:
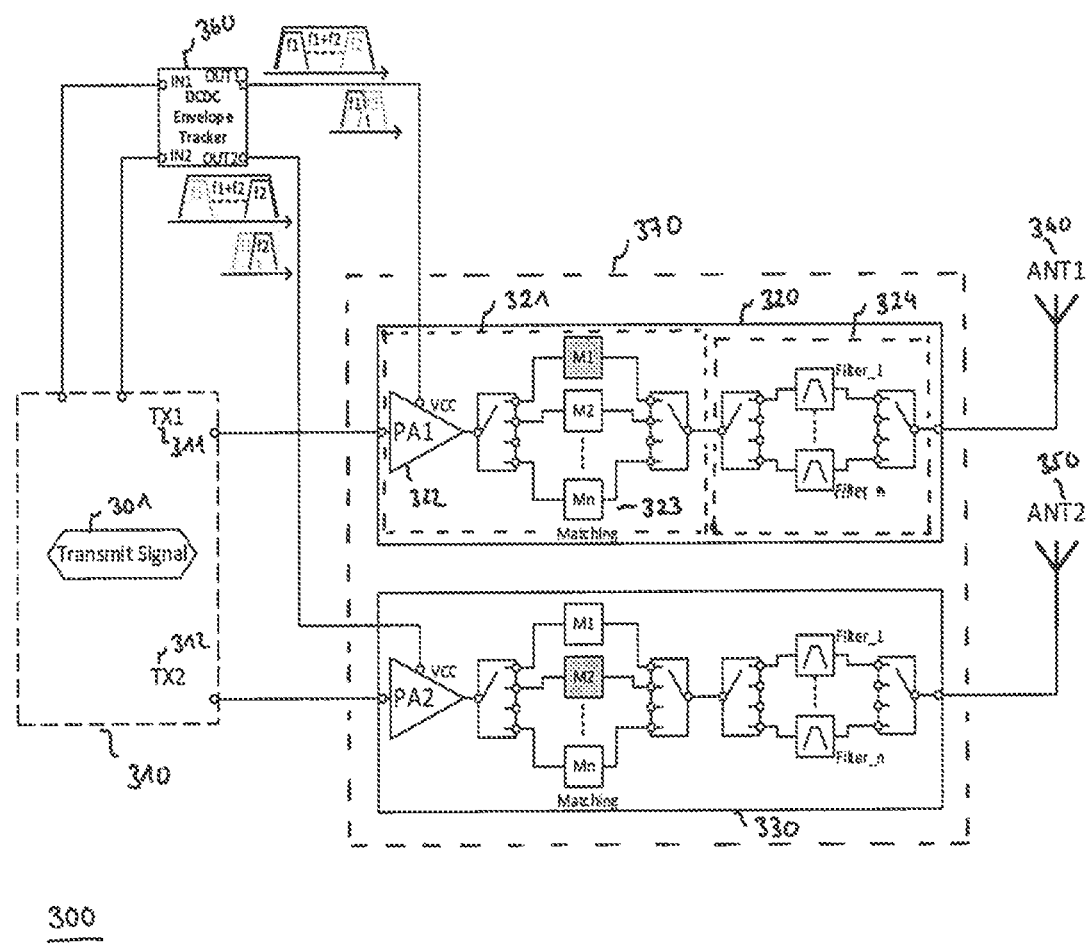
FIG. 3 illustrates a third example of an apparatus for wireless communication.

FIG. 3 illustrates another apparatus 300 for wireless communication (for a mobile device). Apparatus 300 comprises a processing circuit 310 (e.g. a transmitter circuit or a transceiver circuit) configured to receive data 301 to be wirelessly transmitted within a predefined frequency range.

The processing circuit 310 generates two RF transmit signals 311 and 312 aimed to support different frequency ranges. That is, the first RF transmit signal 311 is of a first frequency range, wherein the second RF transmit signal 312 is of a second frequency range.

The first RF transmit signal 311 is further processed (amplified, filtered, etc.) in a first transmit path (front-end chain/path) 320 that is connected (coupled) to first antenna 340. The second RF transmit signal 312 is processed in a second transmit path 330 that is connected (coupled) to second antenna 350. The first transmit path 320 and the second transmit path 330 form a front-end circuit 370.

The processing circuit 310 includes means to (i.e. is configured to) reconfigure the RF transmit signals 311 and 312. For example, the first RF transmit signal 311 may be reconfigured to support the frequency range of the second RF transmit signal 312, and vice versa. Furthermore or alternatively, the RF transmit signals 311 and 312 may be configured to support at least two communication standards (e.g. LTE, 5G NR, WLAN, Bluetooth, etc.).

Also the transmit paths of front-end circuit 370 are reconfigurable. The first transmit path 320 comprises first power amplifier 321, which comprises a power amplifier core circuit 322 (e.g. comprising one or more transistors) for amplifying the first RF transmit signal 311, and an adjustable output impedance matching circuit 323 for adjusting its output impedance. As indicated in FIG. 1, adjustable output impedance matching circuit 323 may comprise switchable impedance matching elements M1, . . . , Mn for reconfiguring the power amplifier core circuit 322 to support different frequency ranges. Alternatively or additionally, the adjustable output impedance matching circuit 323 may comprise a tunable impedance matching element.

For supporting different communication standards, specific biasing of power amplifier core circuit 322 is used. That is, a bias voltage (and/or current) supplied to the power amplifier core circuit 322 is selected based on the used communication standard for the first RF transmit signal 311.

Apparatus 300 further comprises an envelope tracking circuit 360 which supplies a supply voltage to the first power amplifier 321. As indicated in FIG. 1, the supply voltage is based on only the subset of the data 301 used by processing circuit 310 for generating the first RF transmit signal 311. For example, if the data 301 comprises two component carriers at frequencies f1 and f2 (either contiguous or non-contiguous), the supply voltage for the first power amplifier 321 is based on only one of the component carriers. In the example of FIG. 3, the supply voltage for the first power amplifier 321 is based on only the component carrier at frequency f1 since this is the component carrier of the first RF transmit signal 311.

For supporting different communication standards, specific operational configurations (e.g. tracker bandwidth, tracker compression, etc.) for the envelope tracking circuit 360 may be used.

The first transmit path 320 further comprises an adjustable first filter circuit 324 for filtering the first RF transmit signal 311. As indicated in FIG. 1, adjustable first filter circuit 324 may comprise switchable filter banks Filter_1, . . . , Filter_n for reconfiguring the first filter circuit 324 to support different frequency ranges. Alternatively or additionally, the adjustable first filter circuit 324 may comprise a tunable filter element.

The adjustment of the various components of the first transmit path 320 as well as the envelope tracking circuit 360 is done by a control circuit (not illustrated) of apparatus 300. In some examples, the control circuit may, e.g., be a transceiver chip or a transmitter chip. In other example, the control circuit may be implemented in a chip for baseband processing. Also, the control circuit may be implemented as a separate chip.

Compared to the first transmit path 320, the second transmit path 330 comprises equivalent elements. Accordingly, it is referred to the above description of the first transmit path 320, which applies analogously to the second transmit path 330. Also the control circuit may control the second transmit path 330 in an analogous manner. Equivalent to the above description for the first transmit path 320, envelope tracking circuit 360 may supply a supply voltage to the second power amplifier of the second transmit path 330 which is based on only the subset of the data 301 used by processing circuit 310 for generating the second RF transmit signal 312. Referring to the above example, the supply voltage for the second power amplifier of the second transmit path 330 is based on only the component carrier at frequency f2 since this is the component carrier of the second RF transmit signal 312.

For example, apparatus 300 may be operated in the following configurations:

- In a default configuration, the first RF transmit signal 311 and the first transmit path 320 are configured for LTE operation in frequency band 39, whereas the second RF transmit signal 312 and the second transmit path 330 are configured for LTE operation in frequency band 41. In a second configuration, the first RF transmit signal 311 and the first transmit path 320 are reconfigured for LTE operation in frequency band 41. Accordingly, first antenna 340 and second antenna 350 may be used for radiation of 2×2 MIMO signals in frequency band 41. For example, if a diplex-filter supporting frequency bands 39 and 41, 2×2 MIMO in band 41 plus a downlink in frequency band 39 may be realized.
- For intra-band uplink carrier aggregation in frequency band 41 with 120 MHz channel bandwidth, the first RF transmit signal 311 and the first transmit path 320 as well as the second RF transmit signal 312 and the second transmit path 330 are configured for operation in frequency band 41 at 60 MHz channel bandwidth. Accordingly, the first RF transmit signal 311 with 60 MHz bandwidth is radiated to the environment via first antenna 340 and the second RF transmit signal 312 with 60 MHz bandwidth is radiated to the environment via second antenna 350 (It is to be noted that alternatively any other bandwidth split may be used that does not exceed the bandwidth capabilities of the transmit paths).

The channel bandwidths as well as the frequency bands of the above examples are selected purely for illustrative purposes. It is to be noted that any other channel bandwidth or frequency band may be used.

Figure 4:
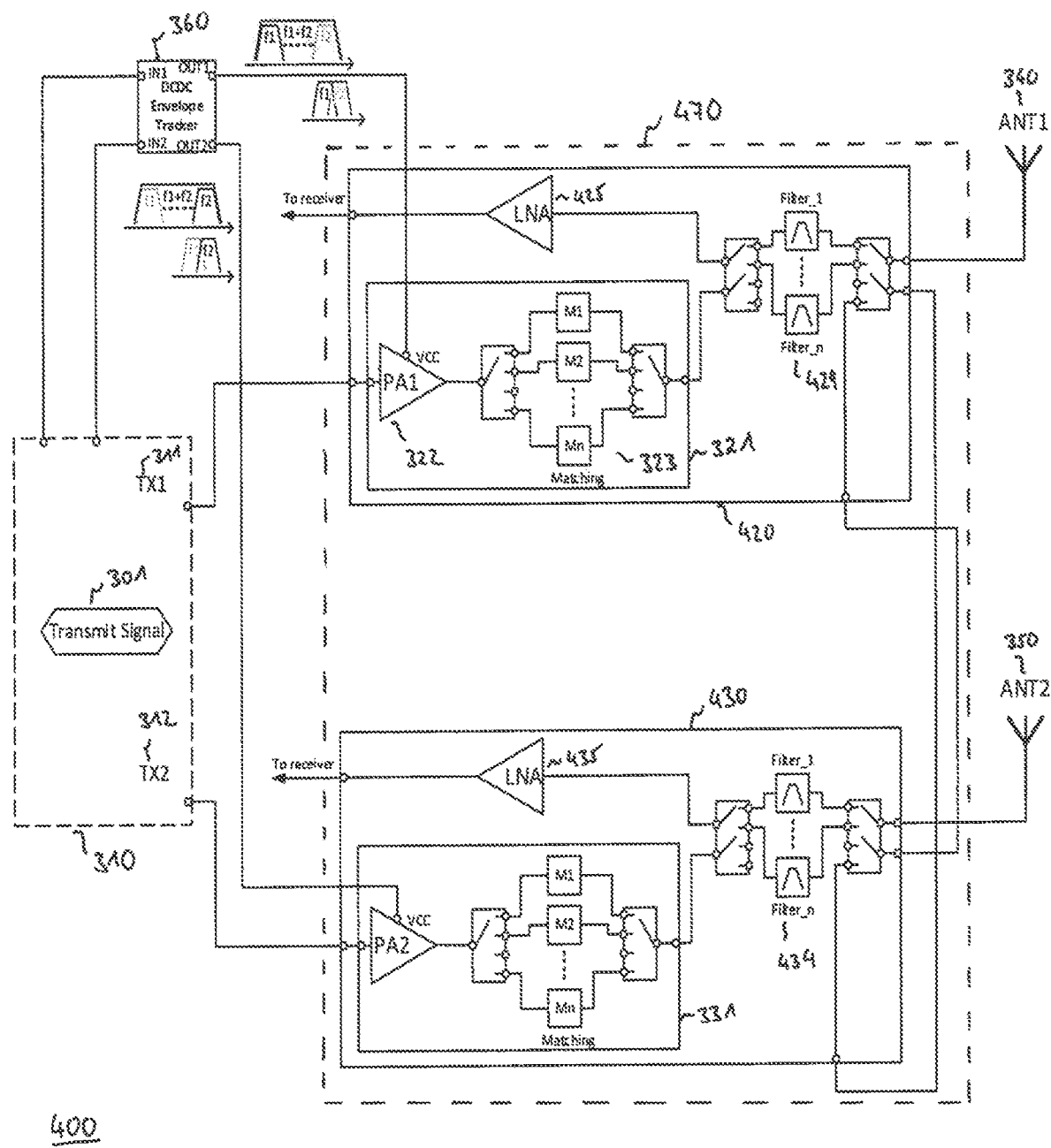
FIG. 4 illustrates a fourth example of an apparatus for wireless communication.

FIG. 4 illustrates another apparatus 400 for wireless communication (for a mobile device). Apparatus 400 is similar to apparatus 300 described above so that only the differences between both apparatuses will be explained in the following.

Apparatus 400 makes use of the fact that in many mobile devices filter banks or tunable filter elements are already present due to the support of MIMO in the receive path. For example, for each supported MIMO frequency, filter banks are connected to the antennas for RF receive signal filtering. As indicated above, these filters may also be used for RF transmit signal filtering (e.g. for MIMO transmit signals) in a TDD mode.

For example, the first transmit path 420 may use the switchable filter banks of the receive path (indicated by low noise amplifier 425) coupled to first antenna 340 as first filter circuit 424 for filtering the first RF transmit signal 311. For example, reconfigurable first power amplifier 321 may be added to an existing receive MIMO module to enable transmit MIMO with minimum area, size and cost impact.

Similarly, the second transmit path 430 may use the switchable filter banks of the receive path (indicated by low noise amplifier 435) coupled to second antenna 350 as second filter circuit 434 for filtering the second RF transmit signal 312. Also the second transmit path 430 may be implemented by adding second power amplifier 332 to an existing receive MIMO module.

For Frequency Division Duplex (FDD) operation, an additional filter may be added between the respective power amplifier and the respective filter circuit of a transmit path.

Again, the transmit paths 420 and 430 form a front-end circuit 470.

Figure 5:
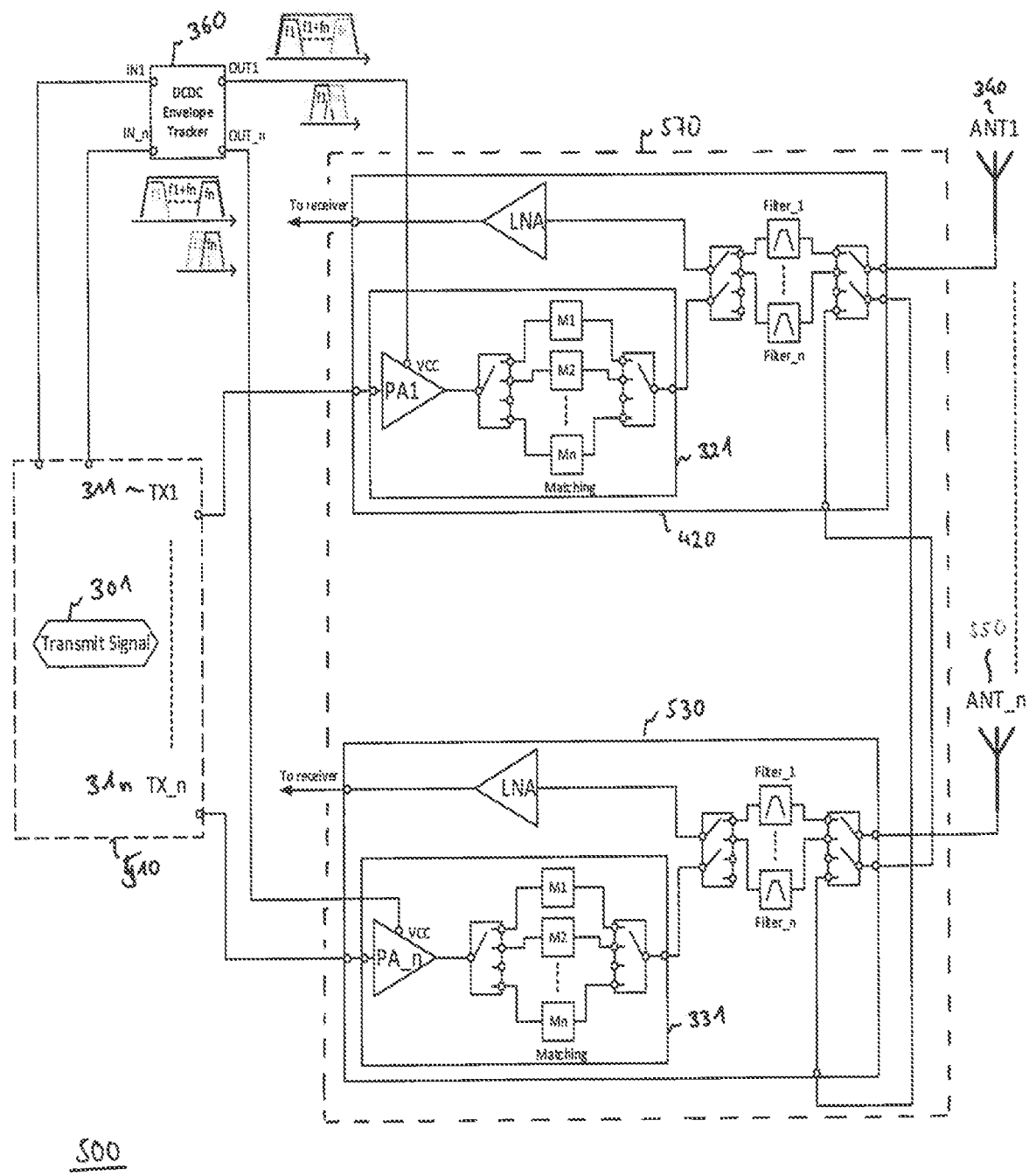
FIG. 5 illustrates a fifth example of an apparatus for wireless communication.

FIG. 5 illustrates another apparatus 500 for wireless communication (for a mobile device). Apparatus 500 is similar to apparatus 400 described above so that only the differences between both apparatuses will be explained in the following.

In contrast to apparatus 400, apparatus 500 comprises more than two antennae. In general, apparatus 500 comprises n antennae (e.g. 4, 6, 8 or more antennae). Accordingly, processing circuit 510 generates n RF transmit signals 311, ..., 31n, which are processed and transferred to the n antennae by n transmit paths forming front-end circuit 570 (indicated by transmit paths 420 for the first RF transmit signal 311 and transmit path 530 for the $n^{th}$ RF transmit signal 31n).

The individual transmit paths are equal to those described above in connection with FIG. 4. However, it is to be noted that in general any other configuration of the transmit paths may be used as well.

In other words, FIG. 5 illustrates an example how apparatuses for wireless communication according to the proposed technique may be further evolved to support more than two reconfigurable transmit paths (e.g. for supporting 4×4 transmit MIMO, or higher channel bandwidths like 400 MHz aggregated channel bandwidth by aggregating four transmit paths with 100 MHz channel bandwidth support per path).

Figure 6:
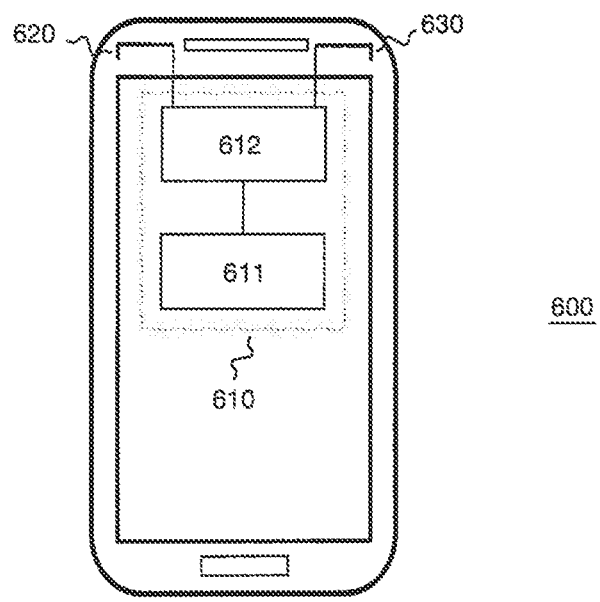
FIG. 6 illustrates an example of a mobile device comprising an apparatus for wireless communication.

An example of an implementation using an apparatus for wireless communication according to one or more aspects of the proposed architecture or one or more examples described above is illustrated in FIG. 6. FIG. 6 schematically illustrates an example of a mobile device 600 (e.g. mobile phone, smartphone, tablet-computer, or laptop) comprising an apparatus 610 for wireless communication according to an example described herein.

The processing circuit 611 of apparatus 610 is coupled to a first antenna 620 and to a second antenna 630 by front-end circuit 612 of apparatus 610 (the individual transmit paths are not illustrated for the sake of clarity). Accordingly, the first RF transmit signal is radiated to the environment by means of first antenna 620, whereas the second RF transmit signal is radiated to the environment by means of second antenna 630. As described above, processing circuit 611 may generate one or more additional RF signals, which may be supplied to one or more additional antennas of mobile device 600 by front-end circuit 612 (i.e. additional transmit paths).

To this end, a mobile device having reduced current consumption and reduced heat dissipation may be provided.

Figure 7:
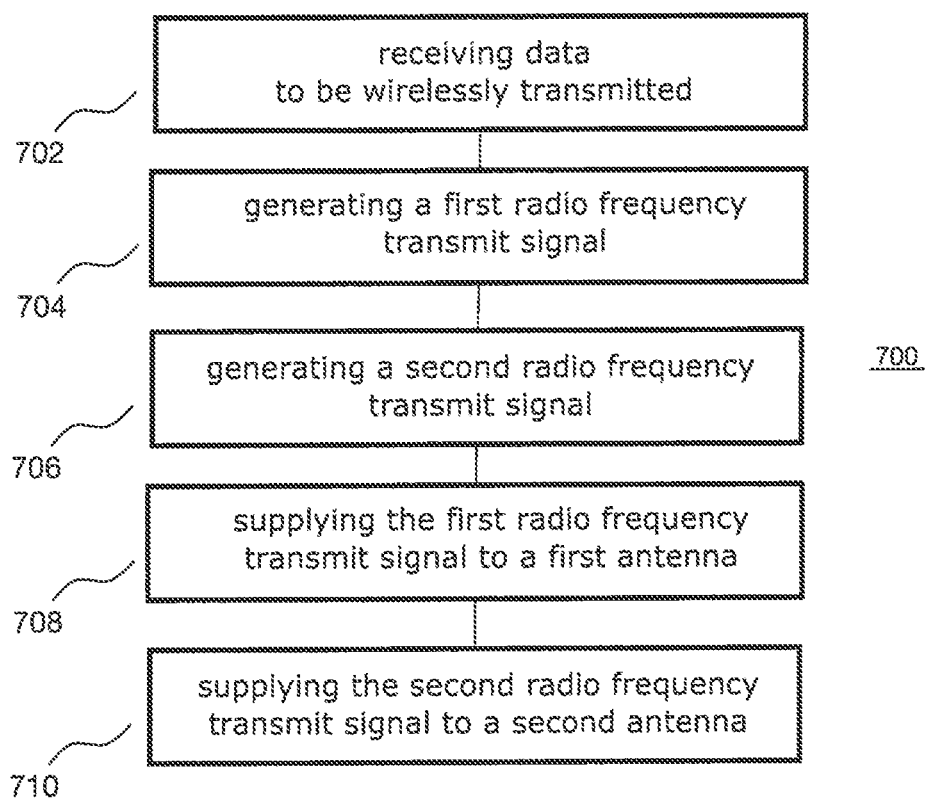
FIG. 7 illustrates a flowchart of an example of a method for wireless communication.

An example of a method 700 for wireless communication is illustrated by means of a flowchart in FIG. 7. Method 700 comprises receiving 702 data to be wirelessly transmitted within a predefined frequency range. Further, method 700 comprises generating 704 a first RF transmit signal of a first frequency range based on the data. Method 700 additionally comprises generating 706 a second RF transmit signal of a second frequency range based on the data. The first frequency range and the second frequency range are subranges of the predefined frequency range. Also, method 700 comprises supplying 708 the first RF transmit signal to a first antenna, and supplying 710 the second RF transmit signal to a second antenna.

More details and aspects of the method are mentioned in connection with the proposed technique or one or more examples described above (e.g. FIGS. 1 and 3 to 5). The method may comprise one or more additional optional features corresponding to one or more aspects of the proposed technique or one or more examples described above.

Figure 8:
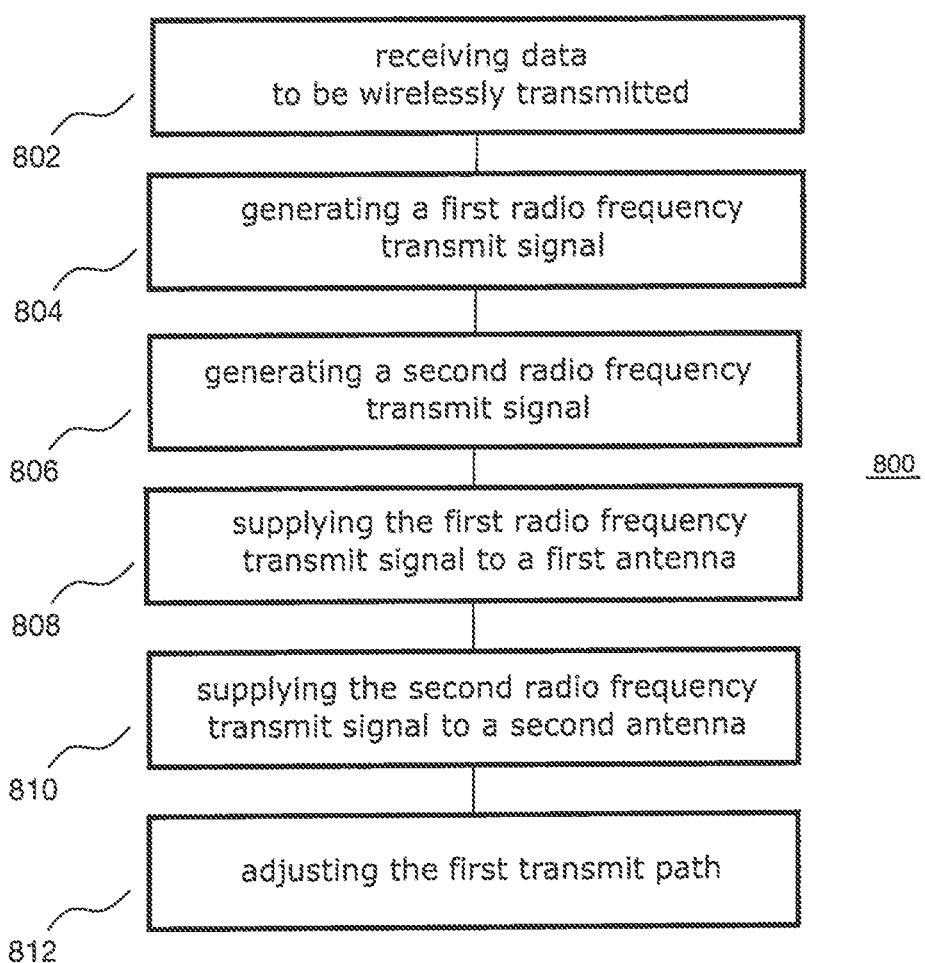
FIG. 8 illustrates a flowchart of another example of a method for wireless communication.

An example of another method 800 for wireless communication is illustrated by means of a flowchart in FIG. 8. Method 800 comprises receiving 802 data to be wirelessly transmitted. Further, method 800 comprises generating 804 a first RF transmit signal based on the data, and generating 806 a second RF transmit signal based on the data. Additionally, method 800 comprises supplying 808 the first RF transmit signal to a first antenna using a first transmit path, and supplying 810 the second RF transmit signal to a second antenna using a second transmit path. The first transmit path supports at least two different configuration states, wherein method 800 further comprises adjusting 812 the first transmit path to one of the at least two different configuration states based on a characteristic of the first RF transmit signal.

More details and aspects of the method are mentioned in connection with the proposed technique or one or more examples described above (e.g. FIGS. 3 to 5). The method may comprise one or more additional optional features corresponding to one or more aspects of the proposed technique or one or more examples described above.

In other words, some examples described herein relate to a communication system with two or more unified transmit chains that can support multiple frequency ranges (e.g. frequency bands according to the 3GPP) and communication standards (e.g. 3G, LTE, 5G NR, WLAN, Bluetooth, etc.). Each transmit chain is connected to a dedicated antenna by means of a reconfigurable front-end. Depending on the use case, the transmit signals are mapped to the antenna system by means of the reconfigurable front-end. As described above, transmit signals may refer to elementary signals such as one or more multiple component carriers of a LTE or 5G NR signal. For example: A LTE signal with 100 MHz aggregated channel bandwidth (conventionally considered as a single signal) may consist of two elementary signals, wherein one signal comprises two component carriers of 40 MHz aggregated bandwidth and the other signal comprises three component carriers with 60 MHz aggregated bandwidth.

Although the proposed technique is described above in connection with wireless communication, the proposed technique may further be applied to wireline communication.

Therefore, examples of the present disclosure further relate to an apparatus for wireline communication. The apparatus comprises a processing circuit configured to receive data to be transmitted within a predefined frequency range. Further, the processing circuit is configured to generate a first transmit signal of a first frequency range based on the data, and to generate a second transmit signal of a second frequency range based on the data. The first frequency range and the second frequency range are subranges of the predefined frequency range. Moreover, the apparatus comprise a front-end circuit configured to supply the first transmit signal to a first wire interface (e.g. a first wire connector to a first transmission wire/fiber), and to supply the second transmit signal to a second wire interface (e.g. a second wire connector to a second transmission wire/fiber).

As described above, the front-end circuit may comprise two or more transmit paths each coupled to a respective wire interface and comprising amplifiers, filter circuits etc. It is therefore referred to the above description. The apparatus for wireline communications may comprise one or more additional optional features corresponding to one or more aspects of the proposed technique or one or more examples described above.

Further, examples of the present disclosure further relate to another apparatus for wireline communication. The apparatus comprises a processing circuit configured to receive data to be transmitted. Further, the processing circuit is configured to generate a first transmit signal based on the data, and to generate a second transmit signal based on the data. Additionally, the apparatus comprises a first transmit path configured to supply the first transmit signal to a first wire interface, wherein the first transmit path supports at least two different configuration states. Also the apparatus comprises a second transmit path configured to supply the second transmit signal to a second wire interface. Further, the apparatus comprises a control circuit configured to adjust the first transmit path to one of the at least two different configuration states based on a characteristic of the first transmit signal.

As described above, the apparatus may optionally comprise more transmit paths, wherein each transmit path is coupled to a respective wire interface and comprises amplifiers, filter circuits etc. It is therefore referred to the above description. The apparatus for wireline communications may comprise one or more additional optional features corresponding to one or more aspects of the proposed technique or one or more examples described above.

The examples as described herein may be summarized as follows:

Example 1 is an apparatus for wireless communication, comprising: a processing circuit configured to: receive data to be wirelessly transmitted within a predefined frequency range; generate a first radio frequency transmit signal of a first frequency range based on the data; and generate a second radio frequency transmit signal of a second frequency range based on the data, wherein the first frequency range and the second frequency range are subranges of the predefined frequency range; and a front-end circuit configured to supply the first radio frequency transmit signal to a first antenna, and to supply the second radio frequency transmit signal to a second antenna.

In example 2, the data in the apparatus of example 1 comprises at least two component carriers according to a communication standard, wherein the processing circuit is configured to: generate the first radio frequency transmit signal based on one of the at least two component carriers; and generate the second radio frequency transmit signal based on another one of the at least two component carriers.

In example 3, the first frequency range and the second frequency range in the apparatus of example 2 are within a frequency band defined in the communication standard.

In example 4, the first frequency range and the second frequency range in the apparatus of example 2 are within different frequency bands defined in the communication standard.

In example 5, the communication standard in the apparatus of any of examples 2 to 4 is a communication standard for cellular communication.

In example 6, the data in the apparatus of any of examples 1 to 5 is to be transmitted contiguously within the predefined frequency range.

In example 7, the data in the apparatus of any of examples 1 to 5 is to be transmitted non-contiguously within the predefined frequency range.

In example 8, the front-end circuit in the apparatus of any of examples 1 to 7 comprises a first transmit path configured to couple the processing circuit to the first antenna, wherein the front-end circuit comprises a second transmit path configured to couple the processing circuit to the second antenna.

In example 9, the first transmit path in the apparatus of example 8 supports at least two different configuration states, wherein the apparatus further comprises a control circuit configured to adjust the first transmit path to one of the at least two configuration states based on the first frequency range.

In example 10, the first transmit path in the apparatus of example 9 comprises a first power amplifier configured to amplify the first radio frequency transmit signal, wherein the first power amplifier supports at least two different output impedance configurations, and wherein the control circuit is further configured to adjust the first power amplifier to one of the at least two output impedance configurations based on the first frequency range.

In example 11, the apparatus of example 10 further comprises an envelope tracking circuit configured to supply a supply voltage to the first power amplifier based on only a subset of the data used by the processing circuit for generating the first radio frequency transmit signal.

In example 12, the first transmit path in the apparatus of any of examples 9 to 11 comprises a first filter circuit configured to filter the first radio frequency transmit signal, wherein the first filter circuit supports at least two different filter configurations, wherein the control circuit is further configured to adjust the first filter circuit to one of the at least two filter configurations based on the first frequency range.

In example 13, the first filter circuit in the apparatus of example 12 is further configured to filter a radio frequency receive signal received by the first antenna.

In example 14, the second transmit path in the apparatus of any of example 9 to 13 supports at least two different configuration states, and wherein the control circuit is further configured to adjust the second transmit path to one of the at least two configuration states based on the second frequency range.

Example 15 is an apparatus for wireless communication, comprising: a processing circuit configured to: receive data to be wirelessly transmitted; generate a first radio frequency transmit signal based on the data; and generate a second radio frequency transmit signal based on the data; a first transmit path configured to supply the first radio frequency transmit signal to a first antenna, wherein the first transmit path supports at least two different configuration states; a second transmit path configured to supply the second radio frequency transmit signal to a second antenna; and a control circuit configured to adjust the first transmit path to one of the at least two different configuration states based on a characteristic of the first radio frequency transmit signal.

In example 16, the characteristic of the first radio frequency transmit signal in the apparatus of example 15 is a frequency range of the first radio frequency transmit signal and/or a communication standard according to which the first radio frequency transmit signal is generated by the processing circuit.

In example 17, the second transmit path in the apparatus of example 15 or example 16 supports at least two different configuration states, wherein the control circuit is further configured to adjust the second transmit path to one of the at least two different configuration states based on a characteristic of the second radio frequency transmit signal.

In example 18, the characteristic of the second radio frequency transmit signal in the apparatus of example 17 is a frequency range of the second radio frequency transmit signal and/or a communication standard according to which the second radio frequency transmit signal is generated by the processing circuit.

In example 19, the data in the apparatus of any of examples 15 to 18 comprises at least two component carriers according to a communication standard, wherein the processing circuit is configured to: generate the first radio frequency transmit signal based on one of the at least two component carriers; and generate the second radio frequency transmit signal based on another one of the at least two component carriers.

In example 20, the processing circuit in the apparatus of any of examples 15 to 19 is configured to generate the first radio frequency signal in a first frequency range, and to generate the second radio frequency signal in a second frequency range.

In example 21, the first frequency range in the apparatus of example 20 is different from the second frequency range.

In example 22, the first frequency range in the apparatus of example 20 is equal to the second frequency range.

In example 23, the second frequency range and the first frequency range in the apparatus of any of examples 20 to 22 are within a frequency band defined in a communication standard.

In example 24, the second frequency range and the first frequency range in the apparatus of example 20 or example 21 are within different frequency bands defined in a communication standard.

In example 25, the communication standard in the apparatus of example 19, example 23 or example 24 is a communication standard for cellular communication.

In example 26, the data in the apparatus of any of examples 20 to 25 is to be transmitted contiguously within a predefined frequency range.

In example 27, the data in the apparatus of any of examples 20 to 25 is to be transmitted non-contiguously within a predefined frequency range.

In example 28, the processing circuit in the apparatus of any of examples 15 to 18 is configured to generate the first radio frequency transmit signal according to a first communication standard, and to generate the second radio frequency transmit signal according to a second communication standard.

In example 29, the first transmit path in the apparatus of any of examples 15 to 28 comprises a first power amplifier configured to amplify the first radio frequency transmit signal, wherein the first power amplifier supports at least two different output impedance configurations, and wherein the control circuit is further configured to adjust the first power amplifier to one of the at least two output impedance configurations based on a frequency range of the first radio frequency transmit signal.

In example 30, the control circuit in the apparatus of example 29 is further configured to adjust a bias voltage supplied to the first power amplifier based on a communication standard according to which the first radio frequency transmit signal is generated by the processing circuit.

In example 31, the apparatus of example 29 or example 30 further comprises an envelope tracking circuit configured to supply a supply voltage to the first power amplifier based on only a subset of the data used by the processing circuit for generating the first radio frequency transmit signal.

In example 32, envelope tracking circuit in the apparatus of example 31 supports at least two different operational configurations, wherein the control circuit is further configured to adjust the envelope tracking circuit to one of the at least two different operational configurations based on a communication standard according to which the first radio frequency transmit signal is generated by the processing circuit.

In example 33, the first transmit path in the apparatus of any of examples 15 to 32 comprises a first filter circuit configured to filter the first radio frequency transmit signal, wherein the first filter circuit supports at least two different filter configurations, and wherein the control circuit is further configured to adjust the first filter circuit to one of the at least two filter configurations based on a frequency range of the first radio frequency transmit signal.

In example 34, the first filter circuit in the apparatus of example 33 is further configured to filter a radio frequency receive signal received by the first antenna.

Example 25 is a mobile device comprising an apparatus for wireless communication according to any of examples 1 to 14, or an apparatus for wireless communication according to any of examples 15 to 34.

Example 36 is a method for wireless communication, comprising: receiving data to be wirelessly transmitted within a predefined frequency range; generating a first radio frequency transmit signal of a first frequency range based on the data; generating a second radio frequency transmit signal of a second frequency range based on the data, wherein the first frequency range and the second frequency range are subranges of the predefined frequency range; supplying the first radio frequency transmit signal to a first antenna; and supplying the second radio frequency transmit signal to a second antenna.

In example 37, the data in the method of example 36 comprises at least two component carriers according to a communication standard, wherein generating the first radio frequency transmit signal is based on one of the at least two component carriers, and wherein generating the second radio frequency transmit signal is based on another one of the at least two component carriers.

In example 38, the first frequency range and the second frequency range in the method of example 37 are within a frequency band defined in the communication standard.

In example 39, the first frequency range and the second frequency range in the method of example 37 are within different frequency bands defined in the communication standard.

In example 40, the communication standard in the method of any of examples 37 to 39 is a communication standard for cellular communication.

In example 41, the data in the method of any of examples 36 to 40 is to be transmitted contiguously within the predefined frequency range.

In example 42, the data in the method of any of examples 36 to 40 is to be transmitted non-contiguously within the predefined frequency range.

In example 43, a first transmit path coupling the processing circuit to the first antenna is used in the method of any of examples 36 to 42 for supplying the first radio frequency transmit signal to the first antenna, wherein a second transmit path coupling the processing circuit to the second antenna is used for supplying the second radio frequency transmit signal to the second antenna.

In example 44, the first transmit path in the method of example 43 supports at least two different configuration states, wherein the method further comprises adjusting the first transmit path to one of the at least two configuration states based on the first frequency range.

In example 45, the first transmit path in the method of example 44 comprises a first power amplifier amplifying the first radio frequency transmit signal, wherein the first power amplifier supports at least two different output impedance configurations, and wherein adjusting the first transmit path comprises adjusting the first power amplifier to one of the at least two output impedance configurations based on the first frequency range.

In example 46, the method of example 45 further comprises supplying, using an envelope tracking circuit, a supply voltage to the first power amplifier based on only a subset of the data used for generating the first radio frequency transmit signal.

In example 47, the first transmit path in the method of any of examples 44 to 46 comprises a first filter circuit filtering the first radio frequency transmit signal, wherein the first filter circuit supports at least two different filter configurations, and wherein adjusting the first transmit path comprises adjusting the first filter circuit to one of the at least two filter configurations based on the first frequency range.

In example 48, the method of example 47 further comprises filtering a radio frequency receive signal received by the first antenna using the first filter circuit.

In example 49, the second transmit path in the method of any of example 44 to 48 supports at least two different configuration states, and wherein the method further comprises adjusting the second transmit path to one of the at least two configuration states based on the second frequency range.

Example 50 is a method for wireless communication, comprising: receiving data to be wirelessly transmitted; generating a first radio frequency transmit signal based on the data; generating a second radio frequency transmit signal based on the data; supplying the first radio frequency transmit signal to a first antenna using a first transmit path, wherein the first transmit path supports at least two different configuration states; supplying the second radio frequency transmit signal to a second antenna using a second transmit path; and adjusting the first transmit path to one of the at least two different configuration states based on a characteristic of the first radio frequency transmit signal.

In example 51, the characteristic of the first radio frequency transmit signal in the method of example 50 is a frequency range of the first radio frequency transmit signal and/or a communication standard according to which the first radio frequency transmit signal is generated.

In example 52, the second transmit path in the method of example 50 or example 51 supports at least two different configuration states, wherein the method further comprises adjusting the second transmit path to one of the at least two different configuration states based on a characteristic of the second radio frequency transmit signal.

In example 53, the characteristic of the second radio frequency transmit signal in the method of example 52 is a frequency range of the second radio frequency transmit signal and/or a communication standard according to which the second radio frequency transmit signal.

In example 54, the data in the method of any of examples 50 to 53 comprises at least two component carriers according to a communication standard, wherein generating the first radio frequency transmit signal is based on one of the at least two component carriers, and wherein generating the second radio frequency transmit signal is based on another one of the at least two component carriers.

In example 55, the first radio frequency signal in the method of any of examples 50 to 54 is generated in a first frequency range, wherein the second radio frequency signal is generated in a second frequency range.

In example 56, the first frequency range in the method of example 55 is different from the second frequency range.

In example 57, the first frequency range in the method of example 56 is equal to the second frequency range.

In example 58, the second frequency range and the first frequency range in the method of any of examples 55 to 57 are within a frequency band defined in a communication standard.

In example 59, the second frequency range and the first frequency range in the method of example 55 or example 56 are within different frequency bands defined in a communication standard.

In example 60, the communication standard in the method of example 54, example 58 or example 59 is a communication standard for cellular communication.

In example 61, the data in the method of any of examples 55 to 60 is to be transmitted contiguously within a predefined frequency range.

In example 62, the data in the method of any of examples 55 to 60 is to be transmitted non-contiguously within a predefined frequency range.

In example 63, the first radio frequency transmit signal in the method of any of examples 50 to 53 is generated according to a first communication standard, wherein the second radio frequency transmit signal is generated according to a second communication standard.

In example 64, the first transmit path in the method of any of examples 50 to 63 comprises a first power amplifier amplifying the first radio frequency transmit signal, wherein the first power amplifier supports at least two different output impedance configurations, and wherein adjusting the first transmit path further comprises adjusting the first power amplifier to one of the at least two output impedance configurations based on a frequency range of the first radio frequency transmit signal.

In example 65, adjusting the first transmit path in the method of example 64 further comprises adjusting a bias voltage supplied to the first power amplifier based on a communication standard according to which the first radio frequency transmit signal is generated.

In example 66, the method of example 64 or example 65 further comprises supplying, using an envelope tracking circuit, a supply voltage to the first power amplifier based on only a subset of the data used for generating the first radio frequency transmit signal.

In example 67, the envelope tracking circuit in the method of example 66 supports at least two different operational configurations, wherein adjusting the first transmit path further comprises adjusting the envelope tracking circuit to one of the at least two different operational configurations based on a communication standard according to which the first radio frequency transmit signal is generated.

In example 68, the first transmit path in the method of any of examples 50 to 67 comprises a first filter circuit filtering the first radio frequency transmit signal, wherein the first filter circuit supports at least two different filter configurations, and wherein adjusting the first transmit path further comprises adjusting the first filter circuit to one of the at least two filter configurations based on a frequency range of the first radio frequency transmit signal.

In example 69, the method of example 68 further comprises filtering a radio frequency receive signal received by the first antenna using the first filter circuit.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Functions of various elements shown in the figures, including various functional blocks labeled as "circuits" may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for wireless communication, comprising:
a processing circuit configured to:
receive data to be wirelessly transmitted within a predefined frequency range;
generate a first radio frequency transmit signal of a first frequency range based on the data; and
generate a second radio frequency transmit signal of a second frequency range based on the data, wherein the first frequency range and the second frequency range are subranges of the predefined frequency range;
a first transmit path that supports at least two different configuration states and is configured to couple the processing circuit to a first antenna to supply the first radio frequency transmit signal to the first antenna, wherein the first transmit path comprises a first power amplifier that supports at least two different output impedance configurations and is configured to amplify the first radio frequency transmit signal;
a second transmit path configured to couple the processing circuit to a second antenna to supply the second radio frequency transmit signal to the second antenna; and
a control circuit configured to
adjust the first transmit path to one of the at least two different configuration states based on the first frequency range, and
adjust the first power amplifier to one of the at least two different output impedance configurations based on the first frequency range.

2. The apparatus of claim 1, wherein the data comprises at least two component carriers according to a communication standard, and wherein the processing circuit is further configured to:
generate the first radio frequency transmit signal based on one of the at least two component carriers; and
generate the second radio frequency transmit signal based on another one of the at least two component carriers.

3. The apparatus of claim 2, wherein the first frequency range and the second frequency range are within a frequency band defined in the communication standard.

4. The apparatus of claim 2, wherein the first frequency range and the second frequency range are within different frequency bands defined in the communication standard.

5. The apparatus of claim 2, wherein the communication standard is a communication standard for cellular communication.

6. The apparatus of claim 1, wherein the data is to be transmitted either contiguously or non-contiguously within the predefined frequency range.

7. The apparatus of claim 1, wherein the apparatus further comprises:
an envelope tracking circuit configured to supply a supply voltage to the first power amplifier based on only a subset of the data used by the processing circuit for generating the first radio frequency transmit signal.

8. The apparatus of claim 1, wherein the first transmit path comprises a first filter circuit that supports at least two different filter configurations and is configured to perform one or more of:
filter the first radio frequency transmit signal; or
filter a radio frequency receive signal received by the first antenna;
wherein the control circuit is further configured to adjust the first filter circuit to one of the at least two filter configurations based on the first frequency range.

9. The apparatus of claim 1, wherein the second transmit path supports at least two different configuration states, and wherein the control circuit is further configured to adjust the second transmit path to one of the at least two configuration states based on the second frequency range.

10. An apparatus for wireless communication, comprising:
a processing circuit configured to:
receive data to be wirelessly transmitted;
generate a first radio frequency transmit signal based on the data; and
generate a second radio frequency transmit signal based on the data;
a first transmit path that supports at least two different configuration states and is configured to couple the processing circuit to a first antenna to supply the first radio frequency transmit signal to the first antenna, wherein the first transmit path comprises a first power amplifier that supports at least two different output impedance configurations and is configured to amplify the first radio frequency transmit signal;
a second transmit path configured couple the processing circuit to a second antenna to supply the second radio frequency transmit signal to a second antenna; and
a control circuit configured to
adjust the first transmit path to one of the at least two different configuration states based on a characteristic of the first radio frequency transmit signal, and
adjust the first power amplifier to one of the at least two different output impedance configurations based on the characteristic of the first radio frequency transmit signal.

11. The apparatus of claim 10, wherein the characteristic of the first radio frequency transmit signal is a frequency range of the first radio frequency transmit signal and/or a communication standard according to which the first radio frequency transmit signal is generated by the processing circuit.

12. The apparatus of claim 10, wherein the second transmit path supports at least two different configuration states, and wherein the control circuit is further configured to adjust the second transmit path to one of the at least two different configuration states based on a characteristic of the second radio frequency transmit signal.

13. The apparatus of claim 12, wherein the characteristic of the second radio frequency transmit signal is a frequency range of the second radio frequency transmit signal and/or a communication standard according to which the second radio frequency transmit signal is generated by the processing circuit.

14. The apparatus of claim 10, wherein the data comprises at least two component carriers according to a communication standard, and wherein the processing circuit is configured to:
generate the first radio frequency transmit signal based on one of the at least two component carriers; and
generate the second radio frequency transmit signal based on another one of the at least two component carriers.

15. The apparatus of claim 10, wherein the processing circuit is configured to generate the first radio frequency signal in a first frequency range, and to generate the second radio frequency signal in a second frequency range;

wherein the first frequency range and the second frequency range are either different from each other or equal to each other.

16. The apparatus of claim 15, wherein the first frequency range and the second frequency range are either:
    within a frequency band defined in a communication standard; or
    within different frequency bands defined in the communication standard.

17. The apparatus of claim 10, wherein the processing circuit is configured to generate the first radio frequency transmit signal according to a first communication standard, and to generate the second radio frequency transmit signal according to a second communication standard.

* * * * *